(12) United States Patent
Matsui et al.

(10) Patent No.: US 8,585,831 B2
(45) Date of Patent: Nov. 19, 2013

(54) SUBSTRATE CLEANING METHOD

(75) Inventors: Hidefumi Matsui, Nirasaki (JP);
Tsuyoshi Moriya, Tokyo (JP); Eiichi Nishimura, Nirasaki (JP); Shinichi Kawaguchi, Nirasaki (JP); Jun Yamawaku, Nirasaki (JP); Kunio Miyauchi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 244 days.

(21) Appl. No.: 13/255,723

(22) PCT Filed: Mar. 10, 2010

(86) PCT No.: PCT/JP2010/054481
§ 371 (c)(1),
(2), (4) Date: Oct. 20, 2011

(87) PCT Pub. No.: WO2010/104206
PCT Pub. Date: Sep. 16, 2010

(65) Prior Publication Data
US 2012/0031434 A1    Feb. 9, 2012

(30) Foreign Application Priority Data

Mar. 12, 2009    (JP) .................................. 2009-059330

(51) Int. Cl.
*B08B 3/00*    (2006.01)

(52) U.S. Cl.
USPC ............................................. 134/26; 134/34

(58) Field of Classification Search
None
See application file for complete search history.

(56) References Cited

U.S. PATENT DOCUMENTS

2002/0170671 A1    11/2002    Matsushita et al.

FOREIGN PATENT DOCUMENTS

| CN | 1440055 A | 9/2003 |
|----|-----------|--------|
| CN | 101176191 A | 5/2008 |
| JP | 6 181050 | 6/1994 |
| JP | 2003 209088 | 7/2003 |
| JP | 2003209088 A * | 7/2003 |
| JP | 2003 298154 | 10/2003 |
| JP | 2008 34858 | 2/2008 |

OTHER PUBLICATIONS

English Machine Translation of JP 2003-209088 A.*
International Search Report issued Apr. 20, 2010 in PCT/JP10/054481 filed Mar. 10, 2010.

\* cited by examiner

*Primary Examiner* — Nicole Blan
(74) *Attorney, Agent, or Firm* — Rothwell, Figg, Ernst & Manbeck, P.C.

(57) ABSTRACT

There is provided a substrate cleaning method capable of cleaning a substrate on which a fine pattern is being formed in a short time with a simple configuration without having a harmful influence on the fine pattern. In the method, the substrate is transferred from a processing chamber for performing a process on the surface of the substrate therein to a cleaning chamber for cleaning the substrate therein. The substrate is cooled to a temperature in the cleaning chamber. A superfluid is supplied to the surface of the substrate, and contaminant components in the fine pattern are flowed out along with the superfluid as the superfluid flows over from the surface of the substrate.

6 Claims, 4 Drawing Sheets

SUBSTRATE CLEANING METHOD

FIELD OF THE INVENTION

The present invention relates to a method for cleaning a substrate on which a fine pattern is formed.

BACKGROUND OF THE INVENTION

For example, as for a manufacturing process of semiconductor devices, when a process such as an etching process, a film forming process or the like is performed on a semiconductor substrate, a processing gas and/or a reaction product (hereinafter, referred to as "contaminant components") from the process remain on a surface of the semiconductor substrate and are then gasified. Such gasified contaminant components may contaminate the surrounding environment of the semiconductor substrate. For that reason, by keeping the processed semiconductor substrate for a time period in a vacuum environment or an environment in which a gas flows (hereinafter, referred to as "purge process"), the contaminant components are removed from the semiconductor substrate by evaporation or the like. Thereafter, the semiconductor substrate may be accommodated in a FOUP and subjected to a next process.

However, in case that a large amount of gas is generated from the semiconductor substrate, the gas is attached on a part of the processing apparatus, so that the part may be corroded or peeled off, resulting in producing particles, for example. Further, it may be difficult to perform the vacuum process depending on the specifications of the processing apparatus. In this case, it takes a long time to perform the purge process, thereby lowering the throughput of the processing apparatus.

Although a method for cleaning a substrate by using a liquid may be suggested to remove the contaminant components, this cleaning method can cause a pattern collapse to occur due to the surface tension of the liquid in an etched pattern or a resist pattern that has been made increasingly fine recently.

Accordingly, a resister removing method has been suggested (see, e.g., Japanese Patent Application Publication No. H06-181050 (JP06-181050A)). Specifically, in a fine pattern forming process where a resister is coated on the surface of a substrate to form a pattern by employing a lithographic approach, a part of the substrate on which the resister is attached is soaked in a supercritical fluid to remove the remaining resister.

Further, an aerosol cleaning method for cleaning a target substrate by spraying an aerosol to the target substrate has been suggested (see, e.g., Japanese Patent Application Publication No. 2003-209088 (JP2003-209088A)). In the aerosol cleaning method, a supercritical state or a pseudo-supercritical state is locally created on the surface of a target substrate to be cleaned by spraying the aerosol to the target substrate at a high speed, to thereby improve the cleaning performance.

However, the cleaning process using the supercritical fluid disclosed in JP06-181050A is required to be performed in a high-temperature and high-pressure state. This results in a complex configuration. Further, the aerosol cleaning method disclosed in JP2003-209088A requires a spraying device for spraying an aerosol at a significantly high speed to a target substrate. This requires the apparatus to be scaled up and more complex. Moreover, the high-speed aerosol can damage the pattern formed on the substrate.

SUMMARY OF THE INVENTION

In view of the above, the present invention provides a substrate cleaning method capable of cleaning a substrate on which a fine pattern is formed in a short time with a simple configuration without having a harmful influence on the fine pattern.

In accordance with an aspect of the present invention, there is provided a substrate cleaning method for cleaning a surface of a substrate on which a fine pattern is formed. The method includes a transfer step in which the substrate is transferred from a processing chamber for performing a process on the surface of the substrate therein to a cleaning chamber for cleaning the substrate therein; a cooling step in which the substrate is cooled to a temperature in the cleaning chamber; and a superfluid cleaning step in which a superfluid is supplied to the surface of the substrate, and contaminant components in the fine pattern are flowed out along with the superfluid as the superfluid flows over from the surface of the substrate.

Preferably, the superfluid cleaning step is carried out by supplying the superfluid to the substrate and collecting the superfluid thus flowing over from the surface of the substrate.

Preferably, the superfluid cleaning step includes: soaking the substrate in the superfluid; and allowing the superfluid to flow over from the surface of the substrate by adjusting a level of the superfluid in which the substrate is soaked to be lower than that of the surface of the substrate.

Preferably, the superfluid is helium.

Preferably, a representative length of the fine pattern is equal to or smaller than 0.1 μm.

Preferably, the method further includes a supercritical fluid cleaning step in which the substrate is cleaned by using a supercritical fluid, the supercritical fluid cleaning step being carried out before or after the superfluid cleaning step.

In accordance with the present invention, it is possible to remove contaminant components from a substrate without allowing pattern collapse to occur in a fine pattern formed on the substrate. This makes it possible to prevent a gas from being generated from the substrate.

Further, in accordance with the present invention, the cleaning process is performed while allowing the contaminant components to flow over from the substrate. This makes it possible to improve the cleanliness of the substrate.

In accordance with the present invention, it is also possible to remove the superfluid having contaminant components from the substrate by using a property of the superfluid which a superfluid flows down over a wall while suppressing the use of the superfluid.

It is also possible to reliably realize the supercritical state.

It is also possible to remove contaminant components without allowing pattern collapse to occur in a fine pattern formed on the substrate even though a representative length of the fine pattern is equal to or smaller than 0.1 μm.

It is also possible to more accurately perform the cleaning process by combining the cleaning steps using the superfluid and the supercritical fluid.

DETAILED DESCRIPTION OF THE EMBODIMENTS

Embodiments of the present invention will now be described with reference to the accompanying drawings which form a part hereof. In the embodiments of the present invention, a substrate processing system in which an etching process is performed on a substrate, e.g., a semiconductor wafer (hereinafter, referred to as "wafer" simply) is used. Hereinafter, a substrate cleaning method in accordance with the embodiments of the present invention will be described.

Figure 1:
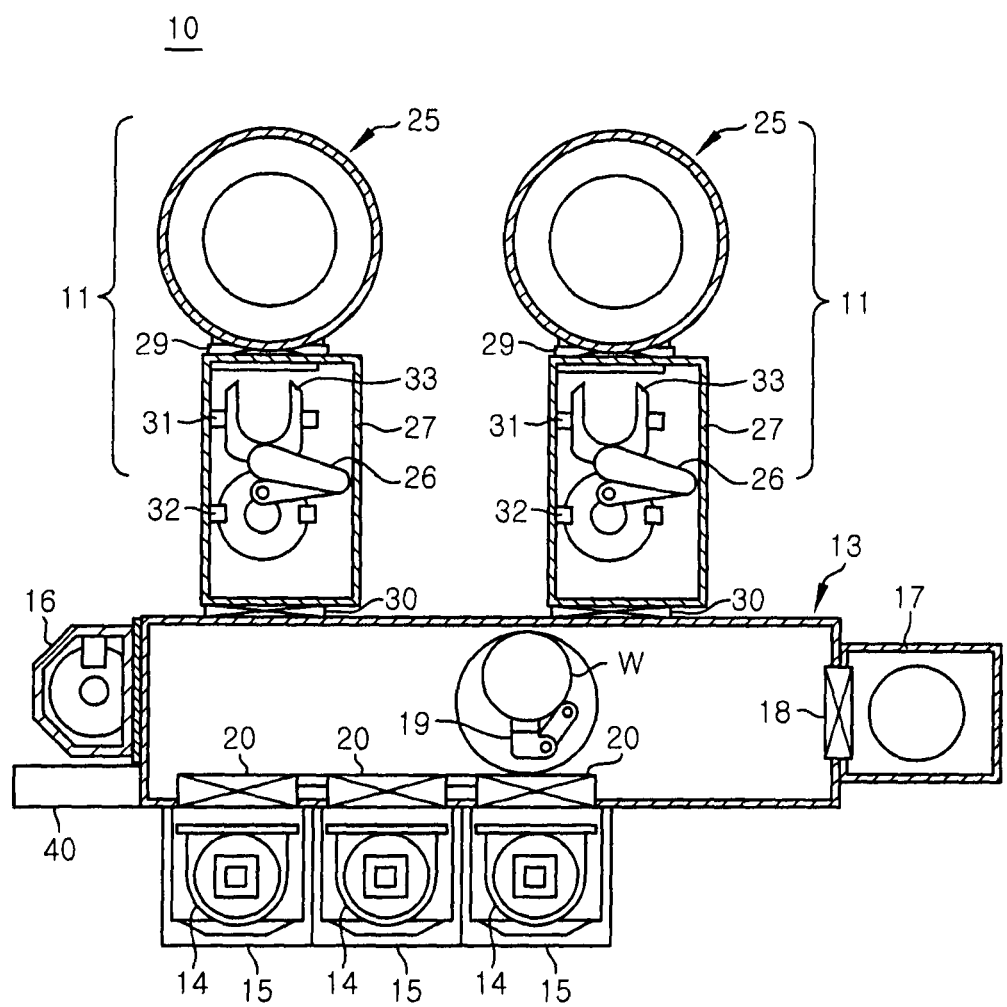
FIG. 1 is a plan view showing a schematic configuration of a substrate processing system in which a substrate cleaning method is to be performed in accordance with a first embodiment of the present invention.

FIG. 1 is a plan view showing a schematic configuration of a substrate processing system 10 in which a substrate cleaning method is to be performed in accordance with a first embodiment. The substrate processing system 10 includes two process ships 11 for each performing a reactive ion etching (RIE) process on a wafer W; and an atmospheric transfer chamber (hereinafter, referred to as "loader module") 13 connected to the two process ships 11, the loader module 13 serving as a rectangular-shaped common transfer chamber.

Also connected to the loader module 13 are three FOUP platforms 15 each for mounting therein a FOUP 14 serving as an accommodating vessel that accommodates, e.g., 25 sheets of wafers W; an orienter 16 for performing a prealignment of a position of the wafer W unloaded from the FOUP 14; and a superfluid cleaning unit 17 for performing a cleaning process on the wafer W that has been subjected to the RIE process.

The two process ships 11 are connected to a longer side of the loader module 13 and provided to face oppositely to the three FOUP platforms 15 with the loader module 13 therebetween. The orienter 16 is connected to one shorter side of the loader module 13, and the superfluid cleaning unit 17 is connected to the other shorter side thereof. The configuration of the superfluid cleaning unit 17 will be described in detail.

The loader module 13 includes therein a dual SCARA (Selective Compliance Assembly Robot Arm) type transfer arm unit 19 for transferring a wafer W. Three load ports 20 are respectively installed at a longer sidewall of the loader module 13 to correspond to the FOUP platforms 15, the load ports serving as input ports for wafers W and FOUP connecting ports. A load port 18 is installed at a shorter sidewall of the loader module 13 to correspond to the superfluid cleaning unit 17. Further, an opening/closing door is provided to each of the load ports 20. With such configuration, the transfer arm unit 19 is used to load and unload wafers W through the load ports 20 between the FOUPs 14 mounted on the FOUP platforms 15 and each of the process ships 11, the orienter 16, and the superfluid cleaning unit 17.

Each of the cylindrical process ships 11 includes a process module 25 serving as a vacuum processing vessel (chamber) in which the wafer W is subjected to the RIE process; and a load-lock module 27 having therein a link type single pick transfer arm 26 for transferring a wafer W to and from the process module 25.

The process module 25 includes a cylindrical chamber for accommodating the wafers W therein; a wafer stage disposed in the chamber to mount the wafers W thereon; and an upper electrode disposed therein to face oppositely to a surface of the wafer stage. The chamber, the wafer stage and the upper electrode are not shown. The wafer stage serves to attract and hold a wafer W by a Coulomb force and serves as a lower electrode, and the distance between the upper electrode and the wafer stage is adequately set to perform the RIE process on the wafer W.

In the process module 25, a processing gas, e.g., hydrogen bromide gas or chlorine gas, is introduced into the chamber, and the processing gas introduced is converted into a plasma by generating an electric field between the upper and the lower electrode, to thereby generate ions and radicals. Then, the RIE process is performed on the wafer W by using the thus generated ions and radicals to etch a polysilicon layer on a surface of the wafer W, for example. As a result, a fine pattern is formed.

The pressure inside the loader module 13 is maintained at the atmospheric pressure, while the inside of each process module 25 is kept in a vacuum state. For that reason, each load-lock module 27 includes a vacuum gate valve 29 provided at a portion connected to the process module 25 and an atmospheric gate valve 30 provided at a portion connected to the loader module 13, so that the pressure inside the load-lock module 27 can be adjusted in the range between a vacuum level and an atmospheric pressure level.

The transfer arm 26 is provided at a substantially central portion of each load-lock module 27. Further, inside the load-lock module 27, a first buffer 31 is provided between the process module 25 and the transfer arm 26; and a second buffer 32 is provided between the loader module 13 and the transfer arm 26. The first and the second buffer 31 and 32 are arranged above a path of a pick 33 supporting the wafer W, the pick 33 being provided at a leading end portion of the transfer arm 26. The first and the second buffer 31 and 32 serve to temporarily put the wafer W having been subjected to the RIE process above the path of the pick 33 to make the changeover smoothly between the wafer W to be subjected to the RIE process and the wafer W having been subjected thereto in the process module 25.

The substrate processing apparatus 10 further includes an operation controller 40 disposed at one end of a shorter side of the loader module 13 to control the operations of the process ships 11, the loader module 13, the orienter 16, and the superfluid cleaning unit 17. In other words, the operation controller 40 executes corresponding programs to perform the RIE process, the cleaning process or the transferring process of the wafers W. In this way, the operations of the components included in the substrate processing apparatus 10 are controlled. Further, the operation controller 40 includes a display unit (not shown), e.g., a liquid crystal display (LCD) for displaying recipes or operation states of various components.

In the substrate processing system 10 having the above configuration, if the FOUP 14 in which a wafer W is accommodated is mounted on the FOUP platform 15, the corresponding load port 20 is opened; and the wafer W is taken out from the FOUP 14 by the transfer arm unit 19 and loaded into the orienter 16. In the orienter 16, a position alignment is performed on the wafer W. Then, the wafer W is taken out from the orienter 16 by the transfer arm unit 19 and transferred onto the transfer arm 26 disposed in the load-lock module 27 that is maintained under the atmospheric pressure state through the atmospheric gate valve 30 of one of the process ships 11.

Then, the atmospheric gate valve 30 is closed and the inside of the load-lock module 27 is changed to the vacuum state. Thereafter, the vacuum gate valve 29 is opened and the wafer W is loaded into the process module 25. The vacuum gate valve 29 is closed and the RIE process is performed on the wafer W in the process module 25. Then, the vacuum gate valve 29 is opened and the wafer W is unloaded from the process module 25 by the transfer arm 26 disposed in the load-lock module 27.

The vacuum gate valve 29 is closed and the inside of the load-lock module 27 is changed back to the atmospheric pressure state. Then, the atmospheric gate valve 30 is opened and the wafer W is transferred from the transfer arm 26 to the transfer arm unit 19. The wafer W supported by the transfer arm unit 19 is loaded into the superfluid cleaning unit 17 and is subjected to the cleaning process therein. The detailed description related to the cleaning process will be made later.

The wafer W that has been subjected to the cleaning process is unloaded from the superfluid cleaning unit 17 by the transfer arm unit 19 and returned to a corresponding FOUP 14.

Figure 2:
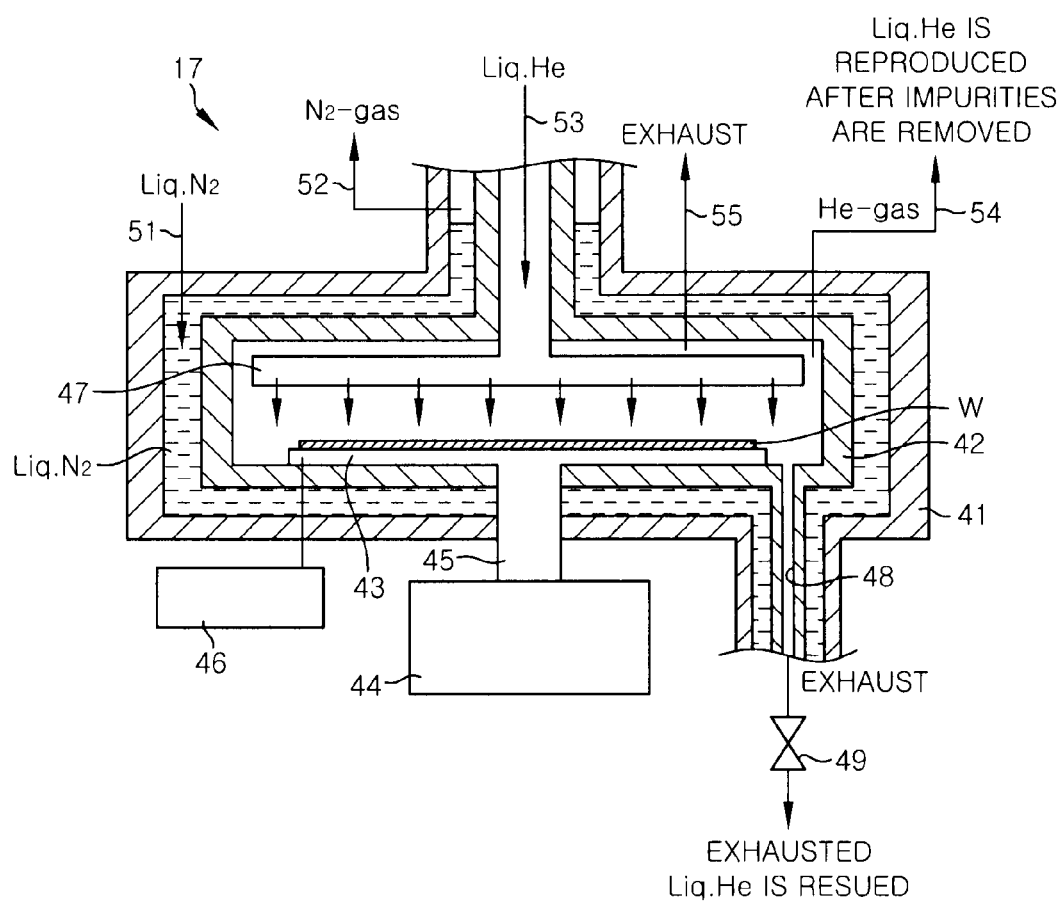
FIG. 2 is a cross sectional view showing a schematic configuration of a cleaning unit included in the substrate processing system shown in FIG. 1.

Next, the superfluid cleaning unit 17 will be described in detail. FIG. 2 is a longitudinal cross sectional view showing the configuration of the superfluid cleaning unit 17. The superfluid cleaning unit 17 includes a cleaning chamber formed of a dual structure having an outer vessel 41; and an inner vessel 42 disposed inside the outer vessel 41. Each of the vessels 41 and 42 has a heat insulating vacuum layer (not shown). A storing space for storing liquid nitrogen (Liq. $N_2$) is provided between the outer vessel 41 and the inner vessel 42. The liquid nitrogen is supplied from the outside to the storing space through a liquid nitrogen supplying line 51, and a nitrogen gas ($N_2$-gas) produced by evaporating the liquid nitrogen in the storing space is exhausted through a nitrogen gas exhaust line 52.

Further, a heat transfer plate formed of a metal, e.g., copper, having a high thermal conductivity may be provided in the storing space such that the liquid nitrogen in the storing space is solidified by transferring a cold heat generated by a refrigeration unit, e.g., a Stirling refrigeration unit, to the heat transfer plate.

A stage 43 for mounting a wafer W thereon is disposed at a bottom portion in the inner vessel 42, and the wafer W is mounted on the stage 43. The stage 43 is connected, via a heat transfer pipe 45, to a refrigeration unit 44 disposed outside the outer vessel 41. As for the refrigeration unit 44, it is preferable to employ a cryogenic refrigeration unit, e.g., a Stirling refrigeration unit. The stage 43 is cooled to a phase transition temperature (=about 2.17 K) at which helium transitions to a superfluid by a cold heat transferred from the refrigeration unit 44 through the heat transfer pipe 45. Accordingly, the wafer W mounted on the stage 43 is also cooled to the phase transition temperature.

In the meantime, a heater (not shown) is buried in the stage 43 to quickly restore the lowered temperature of the wafer W to a room temperature. The heater is powered from a heater power supply 46 in order to emit a heat. For that reason, a heat transfer blocking unit (not shown) is provided in the heat transfer pipe 45 in order to block the transfer of a cold heat from the refrigeration unit 44 to the stage 43. When the heater is operated, the heat transfer blocking unit blocks the transfer of a cold heat generated by the refrigeration unit 44 to the stage 43. Accordingly, it is not necessary to stop the operation of the refrigeration unit 44 and, thus, it is possible to quickly cool the wafer W mounted on the stage 43 after the temperature of the wafer W is restored.

A shower head 47 is disposed at a top portion in the inner vessel 42 to inject a superfluid, e.g., liquid helium (Liq. He), to the wafer W mounted on the stage 43. The liquid helium is supplied from the outside to the shower head 47 through a liquid helium supply line 53.

The phase transition of the liquid helium is carried out at a temperature of about 2.17 K. At this temperature, the liquid helium transitions from a normal fluid state (He I) to a superfluid state (He II). The superfluid helium has no viscosity and shows properties that the superfluid helium tends to flow down over a wall and leak out through even such a hole that only one atom can pass through it.

However, normal fluid helium and superfluid helium exist together at a finite temperature range, and the cleaning effect is obtained due to the normal fluid helium. Further, since the superfluid helium has no viscosity, the cleaning effect for solid-type contaminant components is not obtained by the superfluid helium. On the other hand, molecule-type contaminant components attached on a fine pattern of the wafer W may be physically displaced and removed by the superfluid helium. Accordingly, the liquid helium injected through the shower head 47 is maintained in the superfluid state, and the superfluid helium causes the contaminant components attached on the fine pattern formed on the wafer W to be removed, thereby cleaning the wafer W. The contaminant components result in degassing.

Helium gas (He-gas) produced by evaporating the liquid Helium supplied into the inner vessel 42 is exhausted through a helium gas exhaust line 54. The temperature of a proximity of the load port 18 becomes higher than the boiling point of the liquid helium, and the liquid helium is mainly evaporated at the proximity of the load port 18. The helium gas is re-used by the liquefaction process. Since, however, impurities are included in the helium gas after the cleaning process is performed on the wafers W, the impurities are removed in the liquefaction process.

The liquid helium supplied into the inner vessel 42 is adequately exhausted to the outside through a drain 48 provided at a bottom portion of the inner vessel 42, and is re-used. The exhausting through the drain 48 is controlled by closing and opening a valve 49.

A gas exhaust line 55 is connected to the inner vessel 42 to adjust the inside of the inner vessel 42 to a vacuum state. The gas exhaust line 55 is not essential. Further, by lowering the pressure inside the inner vessel 42, it is possible to easily reach the phase transition temperature of the liquid helium at which the liquid helium transforms from a normal fluid state to a superfluid state without increasing the load of the refrigeration unit 44. In case that the inside of the inner vessel 42 is exhausted to a vacuum level, the inside of the inner vessel 42 is returned to an atmospheric pressure level by using pressure increase caused by evaporation of the liquid helium in the inner vessel 42 or introducing a clean gas into the inner vessel 42 through the gas exhaust line 55 or the helium gas exhaust line 54.

As described above, it is preferable that the superfluid helium be brought into contact with the wafer W. However, it is not necessary that the wafer W be cooled to the phase transition temperature at which the liquid helium is changed to the superfluid state. The wafer W is preferably cooled to such a temperature that the wafer W is not damaged by the first contact of the liquid helium therewith. For example, the wafer W is preferably cooled to such a temperature that most of the liquid helium that is brought into contact with the wafer W instantly is changed to a normal fluid helium and the pattern is not damaged by the normal fluid helium.

Figure 3:
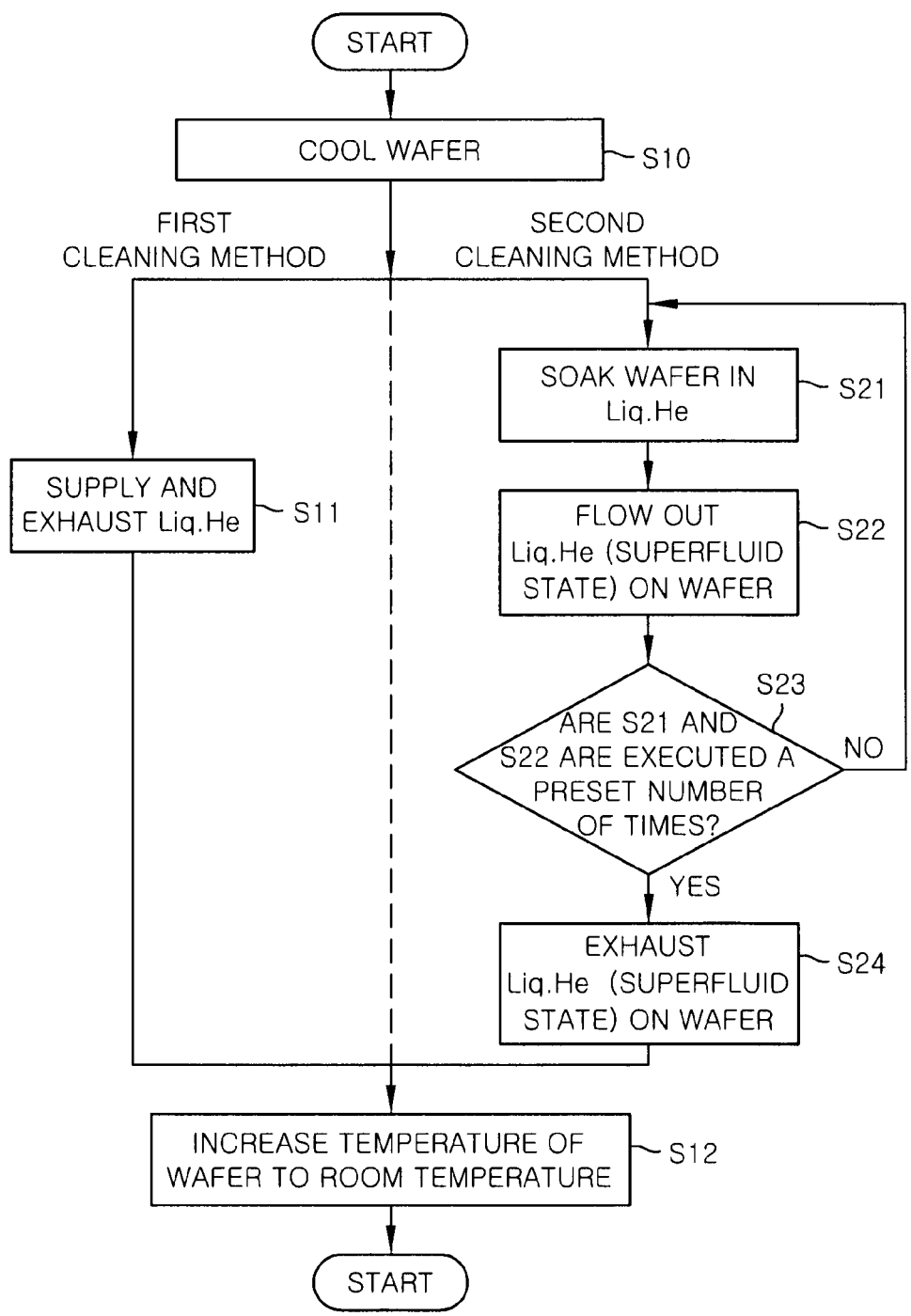
FIG. 3 is a flowchart showing steps of a cleaning process.

Next, the processing steps of the supercritical cleaning unit 17 will be described. FIG. 3 is a flowchart showing steps of a cleaning process. In FIG. 3, a first processing step (first cleaning method) and a second processing step (second cleaning method) are explained together.

In accordance with the first cleaning method, the wafer w is first loaded into the superfluid cleaning unit 17 and mounted onto the stage 43 and, then, the wafer W and the stage 43 are cooled to a predetermined temperature by a cold heat transferred from the refrigeration unit 44 (step S10). Successively, a cleaning process is performed on the wafer W by supplying liquid helium through the shower head 47 to the wafer W and, at this time, the valve 49 is kept open and the liquid helium flowing over from the wafer W is exhausted and collected through the drain 48 (step S11). In step S11, the liquid helium on the wafer W may preferably be under a superfluid state and the inside of the inner vessel 42 may be under an atmospheric pressure or vacuum environment.

Figure 4:
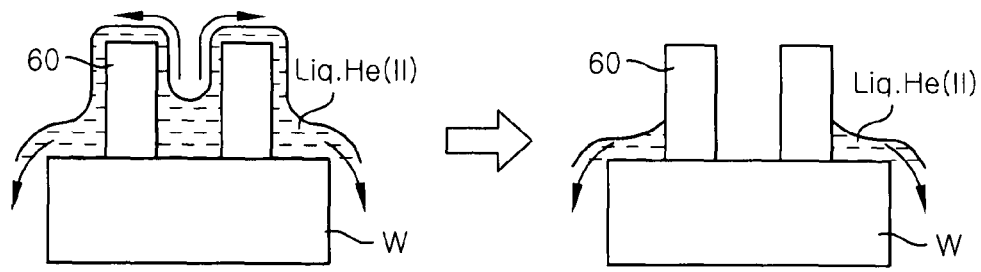
FIG. 4 schematically shows the flow of a superfluid in a fine pattern formed in a substrate.

If the injection of the liquid helium to the wafer W is stopped to finish the step S11, the superfluid helium flows down from the surface of the wafer W. FIG. 4 schematically shows how the superfluid helium leaks out due to its overflowing property that the superfluid helium tends to flow down over a wall.

The superfluid helium in a groove or a hole (e.g., a trench or a hole formed by the RIE process) between the protrusions 60 of a fine pattern formed on the wafer W flows, over the protrusions 60, down to a lower level place due to the overflowing property as shown in a left side of FIG. 4, even when the level of the superfluid helium is lower than those of the tops of the protrusions 60.

Accordingly, as shown in a right side of FIG. 4, no superfluid helium remains in the groove or the hole between the protrusions 60 and all the superfluid helium flows down from the surface of the wafer W. Since the superfluid helium has no viscosity, no pattern collapse occurs even when a significantly finer pattern is formed. For that reason, the cleaning process to be performed on the wafer W by using the superfluid helium is preferably employed in case that a representative length of a fine pattern formed on the wafer W is equal to or smaller than 0.1 μm.

After the superfluid helium flows down from the wafer W, the valve 49 is closed; the transfer of a cold heat to the stage 43 is blocked; and the wafer W is returned to a room temperature (step S12). Then, the wafer W is unloaded from the supercritical cleaning unit 17 and accommodated into the FOUP 14.

In accordance with the second cleaning method, the wafer w is first loaded into the superfluid cleaning unit 17 and mounted onto the stage 43 and, then, the wafer W and the stage 43 are cooled to a predetermined temperature by a cold heat transferred from the refrigeration unit 44 (step S10). Successively, the valve 49 is closed and liquid helium is supplied through the shower head 47 to the wafer W and, then, the liquid helium is stored in the inner vessel 42. When the wafer W is soaked in the liquid helium, the supply of the liquid helium is stopped (step S21).

At this time, if the liquid helium is under a superfluid state, the process goes to step S22 after a predetermined time period. If the liquid helium is under a normal fluid state, the liquid helium is changed to the superfluid state by cooling or pressurizing the inner vessel 42 and, then, the wafer W is soaked in the superfluid helium. In other words, the wafer W is soaked in the superfluid helium between step S21 and step S22.

After the wafer W is soaked in the superfluid helium, a certain amount of the superfluid helium is exhausted from the inner vessel 42 by opening the valve 49 such that the level of the superfluid helium becomes lower than that of the surface of the wafer W. Accordingly, as described above with reference to FIG. 4, the superfluid helium on the wafer W flows over from the surface of the wafer W and, thus, no superfluid helium resultantly remains on the wafer W (step S22).

In the second cleaning method, the cleaning process is performed once by executing step S21 and step S22 as one set. It is possible to more accurately perform the cleaning process on the wafer W by executing step S21 and step S22 a predetermined number of times.

Next, it is determined whether step S21 and step 22 have been executed a predetermined number of times (step S23). In case when the determination of step S23 is "YES", the valve 49 is opened and the superfluid helium in the inner vessel 42 is exhausted and collected (step S24). On the other hand, in case when the determination of step S23 is "NO", the process returns to step S21 in which the cleaning process is performed on the wafer W.

After step S24, the process returns to step S12 in which the valve 49 is closed; the transfer of a cold heat to the stage 43 is blocked; and the wafer W is returned to a room temperature. In this way, the wafer W whose temperature is returned to the room temperature is unloaded from the superfluid unit 17 and accommodated into the FOUP 14.

In the superfluid cleaning unit 17, the cleaning process may be performed on the wafer W by combining the first and the second cleaning method. In the meantime, it is expected that metal contaminant components are removed by adding fluorine into the superfluid helium; and contaminant components having reactivity with oxygen are removed by adding ozone into the superfluid helium.

Figure 5:
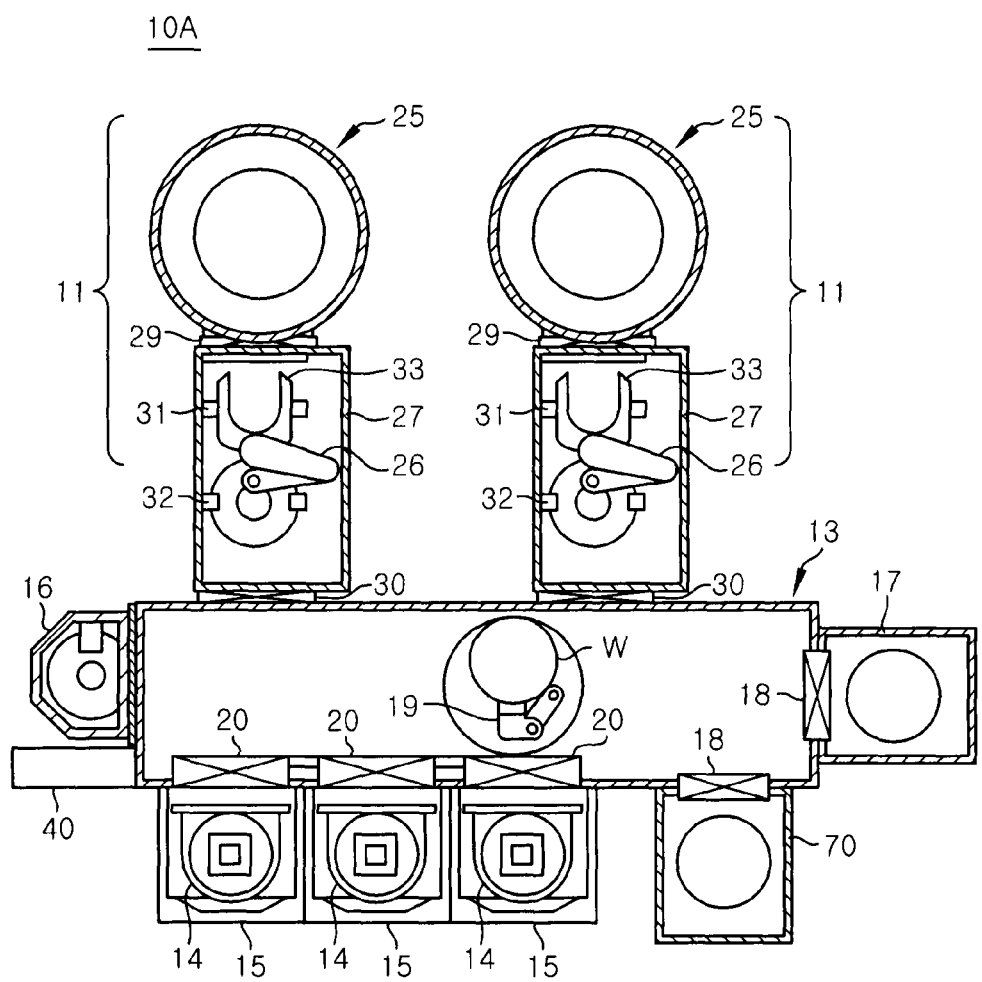
FIG. 5 is a plan view showing a schematic configuration of a substrate processing system in which a substrate cleaning method is to be performed in accordance with a second embodiment of the present invention.

Next, another substrate processing system 10A in which a substrate cleaning method is to be performed in accordance with a second embodiment of the present invention will be described. FIG. 5 is a plan view showing a schematic configuration of the substrate processing system 10A. The substrate processing system 10A has a configuration further including a supercritical fluid cleaning unit 70 for performing a supercritical cleaning process on the wafer W in addition to the configuration of the substrate processing system 10. For that reason, an outline of the supercritical fluid cleaning unit 70 will be described hereinafter.

The supercritical fluid cleaning unit 70 is connected to the sidewall of the loader module 13 while being disposed in parallel with the FOUP platform 15. The layout position of the supercritical fluid cleaning unit 70 is not limited thereto. Alternatively, the supercritical fluid cleaning unit 70 may be disposed at a side of the process ship 11 or to the top of the superfluid cleaning unit 17, forming a multi-staged cleaning unit.

The detailed description related to the configuration of the supercritical fluid cleaning unit 70 will be omitted. The supercritical fluid cleaning unit 70 roughly includes a high-temperature and high-pressure chamber for accommodating a wafer W therein; a temperature control unit for controlling the temperature inside the high-temperature and high-pressure chamber; a pressure control unit for controlling the pressure in the high-temperature and high-pressure chamber; a medium supply/exhaust line through which a supercritical fluid is supplied to or exhausted from the high-temperature and high-pressure chamber; and a purge line for purging the inside of the high-temperature and high-pressure chamber by using a nonreactive gas such as nitrogen gas or the like. For example, a nonreactive gas such as carbon dioxide ($CO_2$), Argon (Ar) or the like may be employed as the supercritical fluid.

The cleaning process using the supercritical fluid cleaning unit 70 may be performed on the wafer W before or after the cleaning process using the superfluid cleaning unit 17. By using both the superfluid cleaning unit 17 and the supercritical fluid cleaning unit 70, it is possible to perform the cleaning process more accurately. For example, contaminant components that have not been removed by using only one of the cleaning processes 17 and 70 may be removed by using the other cleaning process 17 or 70, additionally. In the supercritical fluid cleaning unit 70, contaminant components are removed by exposing the wafers W to a supercritical fluid for a predetermined time period. Since the supercritical fluid is gaseous, pattern collapse does not occur on a fine pattern formed on the wafer W.

Hitherto, the embodiments of the present invention have been described. The present invention, however, is not limited to the embodiments. For example, although the substrate processing system including a process module 25 for performing the RIE process on the wafer W has been taken as an example, the process module may perform a film-forming process or a diffusion process on the wafer W.

In the embodiments, the substrate processing unit 10 or 10A has been obtained by connecting the superfluid cleaning unit 17 to a device for performing the RIE process. Since the superfluid cleaning unit 17 is connectable to various processing devices for performing the RIE process, the film-forming process, the diffusion process or the like, the superfluid cleaning unit 17 is easily applicable to the existing processing device. However, the superfluid cleaning unit 17 may be employed as a separate cleaning unit without being connected to the processing device.

In the respective embodiments, a semiconductor wafer is employed as the substrate, but the substrate is not limited thereto. For example, the substrate may be one of various kinds of substrates, which can be used in a flat panel display (FPD) including a liquid crystal display (LCD) or the like, a photomask, a CD substrate, a print substrate or the like.

The purpose of the present invention can be achieved by providing a system or an apparatus with a storage medium or the like storing program codes of software realizing the functions of the respective embodiments and allowing a computer (or a central processing unit (CPU) or a microprocessor unit (MPU)) thereof to read and execute the program codes accumulated in the medium through the operation controller 40.

In this case, the program codes themselves read from the medium realize the functions of the aforementioned embodiments and the present invention includes the program codes and the medium storing the program codes.

The medium for providing the program codes may be, e.g., a floppy(registered trademark) disk; a hard disk; an optical disk, e.g., a magneto-optical disk, CD-ROM, CD-R, CD-RW, DVD-ROM, DVD-RAM, DVD-RW, DVD+RW or the like; a magnetic tape; a nonvolatile memory card; ROM; or the like. The program codes may also be downloaded from another computer, database or the like, which are not shown, connected thereto through the Internet, a commercial network, a local area network or the like.

The functions of the aforementioned embodiments can be realized by executing the program codes read by the computer. Alternatively, an operating system (OS) or the like operating on the computer can execute a part or the whole of the actual processing in accordance with the instructions of the program codes and the functions of the embodiments can be realized by the processing executed by the OS or the like.

In addition, the program codes can be read from a storage and inputted to a memory in a built-in function extension board or an external function extension unit of a computer and the functions of the embodiments can be realized by the processing of a CPU or the like in the extension board or the extension unit, which executes the extension function thereof in accordance with the instructions of the program codes to perform a part or the whole of the actual processing.

The program codes may include object codes, program codes to be executed by an interpreter, script data to be supplied to the OS, and the like.

What is claimed is:

1. A substrate cleaning method for cleaning a surface of a substrate on which a fine pattern is formed, the method comprising:
    a transfer step in which the substrate is transferred from a processing chamber for performing a process on the surface of the substrate therein to a cleaning chamber for cleaning the substrate therein;
    a cooling step in which the substrate is cooled to a temperature in the cleaning chamber; and
    a superfluid cleaning step in which a superfluid in a superfluid state is supplied to the surface of the substrate, and contaminant components in the fine pattern are flowed out along with the superfluid as the superfluid flows over from the surface of the substrate.

2. The method of claim 1, wherein the superfluid cleaning step is carried out by supplying the superfluid to the substrate and collecting the superfluid thus flowing over from the surface of the substrate.

3. The method of claim 1, wherein the superfluid cleaning step includes:
    soaking the substrate in the superfluid; and
    allowing the superfluid to flow over from the surface of the substrate by adjusting a level of the superfluid in which the substrate is soaked to be lower than that of the surface of the substrate.

4. The method of claim 1, wherein the superfluid is helium.

5. The method of claim 1, wherein a representative length of the fine pattern is equal to or smaller than 0.1 μm.

6. The method of claim 1, further comprising: a supercritical fluid cleaning step in which the substrate is cleaned by using a supercritical fluid, the supercritical fluid cleaning step being carried out before or after the superfluid cleaning step.

* * * * *

UNITED STATES PATENT AND TRADEMARK OFFICE
CERTIFICATE OF CORRECTION

PATENT NO. : 8,585,831 B2 Page 1 of 1
APPLICATION NO. : 13/255723
DATED : November 19, 2013
INVENTOR(S) : Matsui et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 282 days.

Signed and Sealed this
Twenty-second Day of September, 2015

Michelle K. Lee
*Director of the United States Patent and Trademark Office*